United States Patent
Ali et al.

(10) Patent No.: US 7,352,228 B2
(45) Date of Patent: Apr. 1, 2008

(54) METHOD AND APPARATUS OF A LEVEL SHIFTER CIRCUIT WITH DUTY-CYCLE CORRECTION

(75) Inventors: Shahid Ali, Bangalore (IN); Sujan Manohar, Karnataka (IN); Satheesh Balasubramanian, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/416,608

(22) Filed: May 3, 2006

(65) Prior Publication Data
US 2007/0257722 A1    Nov. 8, 2007

(51) Int. Cl.
*H03L 5/00* (2006.01)

(52) U.S. Cl. .................. 327/333; 327/315; 326/60; 326/61; 326/62; 326/63; 326/80; 326/83

(58) Field of Classification Search ........... 327/333
See application file for complete search history.

(56) References Cited

U.S. PATENT DOCUMENTS

| | | | | |
|---|---|---|---|---|
| 5,969,542 A | * | 10/1999 | Maley et al. ............ | 326/81 |
| 6,011,421 A | * | 1/2000 | Jung ...................... | 327/333 |
| 2005/0285658 A1 | * | 12/2005 | Schulmeyer et al. ...... | 327/333 |
| 2007/0013431 A1 | * | 1/2007 | Owen .................... | 327/333 |
| 2007/0132498 A1 | * | 6/2007 | Hasegawa et al. ........ | 327/333 |

* cited by examiner

*Primary Examiner*—Tuan T. Lam
*Assistant Examiner*—Hiep Nguyen
(74) *Attorney, Agent, or Firm*—Alan K. Stewart; W. James Brady; Frederick J. Telecky, Jr.

(57) ABSTRACT

A method and/or a system of control signal synchronization of a scannable storage circuit is disclosed. In one embodiment, a system includes a first circuit to operate based on a first voltage of a first power supply, a second circuit to operate based on a second voltage of a second power supply, a level shifter circuit between the first circuit and the second circuit to translate between the first voltage of the first power supply and the second voltage of the second power supply, and a n-channel metal-oxide semiconductor field-effect transistor (nMOSFET) having a gate input of the second voltage and serially coupled in a fall path of the level shifter circuit to increase a rate of a capacitive discharge such that the rate of a capacitive discharge charge is substantially equal to a rate of a capacitive charge (e.g., the fall delay may also increase a bit because of an extra transistor).

18 Claims, 4 Drawing Sheets

METHOD AND APPARATUS OF A LEVEL SHIFTER CIRCUIT WITH DUTY-CYCLE CORRECTION

FIELD OF TECHNOLOGY

This disclosure relates generally to the technical fields of electronics and integrated circuit technology and, in one example embodiment, to a method, apparatus and/or system of a level shifter circuit with duty-cycle correction.

BACKGROUND

An integrated circuit (e.g., an electronic circuit formed on a substrate of semiconductor material) may operate at faster speeds and/or may be physically smaller as semiconductor technology improves (e.g., transistors forming the integrated circuit may have less delay because of smaller physical size). As the integrated circuit becomes faster and physically smaller, the integrated circuit may dissipate more dynamic power (e.g., power when the integrated circuit is powered and is switching). The dynamic power may increase because a larger number of transistors may be formed in a given area of the substrate.

One way to reduce the dynamic power consumed is to reduce a supply voltage that powers the integrated circuit. However, this reduction may adversely affect a performance (e.g. maximum clock speed) of the integrated circuit. The integrated circuit may include multiple sub-circuits controlled by different power supplies to minimize the dynamic power consumed by the integrated circuit (e.g., non-critical paths may be powered by lower power supplies).

However, by having multiple sub-circuits controlled by different power supplies, the integrated circuit may dissipate more static power (e.g., power when the integrated circuit is powered but not switching). The static power may increase because gate oxides may become thinner in small transistors that form the integrated circuit and because of a voltage ramp time between the multiple sub-circuits.

The level shifter circuit may be an electronic component that can help deliver an output that is at a same voltage as a power domain. In addition, the level shifter may help to minimize the static power in the integrated circuit by providing an output voltage at a desired voltage with minimum transition voltages (e.g., while a voltage level is adjusting to the output voltage, transition voltages can create leakage because n-type and p-type transistors of the level shifter circuit may simultaneously be active during the transition voltages because they may be partially on at the transition voltages).

However, the integrated circuit may not operate with a faster clock frequency (e.g., currently 3.8 GHz in many applications though in future generations of application specific integrated circuits it may be faster) when the level shifter circuit is used because the level shifter circuit can have an inherent duty cycle error (e.g., a duty cycle may be a ratio of time a clock signal is in a high state as a percentage of total time in a period). The inherent duty cycle error can cause a number of problems because a component (e.g., a memory) coupled to the integrated circuit (e.g., and/or sub-circuits forming the integrated circuit) may expect a constant duty cycle (e.g., often 50%), and the inherent duty cycle error can cause erroneous data to be transmitted to the component (e.g., the duty cycle may be skewed to 45% because of the inherent duty cycle error).

In addition, the integrated circuit having the level shifter circuit may not internally communicate reliable data when the faster clock frequency is used because a delay in a flip-flop of the integrated circuit may be larger than an 'on' time of an output of the level shifter circuit (e.g., the output of the level shifter circuit in a high state) having the inherent duty cycle error. Therefore, the inherent duty cycle error can cause the integrated circuit to fail when the faster clock frequency is used and/or can impose a limit on a maximum clock speed of the integrated circuit.

SUMMARY

A method, apparatus and/or system of a level shifter circuit with duty-cycle correction is disclosed. In one aspect, a system includes a first circuit to operate based on a first voltage of a first power supply, a second circuit to operate based on a second voltage of a second power supply, a level shifter circuit between the first circuit and the second circuit to translate between the first voltage of the first power supply and the second voltage of the second power supply, and a n-channel metal-oxide semiconductor field-effect transistor (nMOSFET) having a gate input of the second voltage and serially coupled in a fall path of the level shifter circuit to increase a rate of a capacitive discharge such that the rate of a capacitive discharge is substantially equal to a rate of a capacitive charge.

A difference in the rate of capacitive discharge and the rate of capacitive charge may be affected by different paths traversed, transistor sizes, input and output voltages of the level shifter (e.g., an intrinsic diffusion capacitance of the level shifter circuit), etc. The second voltage and/or the first voltage may have a variable voltage. The nMOSFET may rectify a skew in a duty cycle of the level shifter circuit associated with the intrinsic diffusion capacitance. In addition, the duty cycle may be maintained at a constant level of approximately 50% throughout the system. Also, the duty cycle may and or may/not be shared with at least one component external to the system. The nMOSFET may be placed in a space between voltage n-wells of the level shifter circuit without increasing a physical area of the level shifter circuit. In addition, the nMOSFET may be serially placed before an inverter circuit in the fall path of the level shifter circuit.

The nMOSFET may balance rise and fall paths of the level shifter circuit. Furthermore, a serially coupled pair of p-channel metal-oxide semiconductor field-effect transistors (pMOSFETs) may be placed in a rise path of the level shifter circuit to reduce power dissipation (e.g., static power and/or dynamic power) of the system.

In another aspect, a level shifter circuit may include a first set of transistors contributing to an intrinsic capacitive charge time, a second set of transistors contributing to an intrinsic capacitive discharge time, and a n-channel metal-oxide semiconductor field-effect transistor (nMOSFET) coupled to the second set of transistors having a gate input of an output voltage of the level shifter circuit to reduce the intrinsic capacitive discharge time such that the intrinsic capacitive discharge time is substantially equal to the intrinsic capacitive charge time. A difference in the intrinsic capacitive discharge time and the intrinsic capacitive charge time may be affected by a diffusion capacitance parasitically associated with the level shifter circuit, and the output voltage may be a variable voltage dependent upon a voltage requirement of a logic circuit coupled to the output of the level shifter. The first set of transistors may be associated with a rise path of the level shifter circuit, and the second set of transistors may be associated with a fall path of the level shifter circuit. The level shifter circuit may be serially coupled anywhere in the fall path.

In yet another aspect, a method includes placing an n-channel metal-oxide semiconductor field-effect transistor (nMOSFET) in a fall path of a level shifter circuit, coupling a voltage to a gate of the nMOSFET such that the voltage is the same as that of a circuit coupled to an output of the level shifter circuit, and reducing an inherent duty cycle error of the level shifter circuit balancing rise and fall paths of the circuit. In addition, the method may include placing a serially coupled pair of p-channel metal-oxide semiconductor field-effect transistors (pMOSFETs) in a rise path of the level shifter circuit to reduce power dissipation (e.g., static power and/or dynamic power).

The system, apparatuses (e.g., the level shifter), and method disclosed herein may be implemented in any means for achieving various aspects, and may be executed in a form of a machine-readable medium embodying a set of instructions that, when executed by a machine, cause the machine to perform any of the operations disclosed herein. Other features will apparent from the accompanying drawings and from the detailed description that follows.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

A method, apparatus and/or system of a level shifter circuit with duty-cycle correction is disclosed. In the following description, for the purposes of explanation, numerous specific details are set forth in order to provide a thorough understanding of the various embodiments. It will be evident, however to one skilled in the art that the various embodiments may be practiced without these specific details.

In one embodiment, a system includes a first circuit (e.g., circuit 100 of FIG. 1) to operate based on a first voltage (e.g., a voltage $VDD_1$ 114 of FIG. 1) of a first power supply, a second circuit (e.g., a circuit 102 of FIG. 1) to operate based on a second voltage (e.g., a voltage $VDD_2$ 116 of FIG. 1) of a second power supply, a level shifter circuit (e.g., a level shifter circuit 150 of FIG. 1) between the first circuit and the second circuit to translate between the first voltage of the first power supply and the second voltage of the second power supply, and a n-channel metal-oxide semiconductor field-effect transistor (nMOSFET) (e.g., an nMOSFET 218 of FIG. 2A) having a gate input of the second voltage and serially coupled in a fall path of the level shifter circuit to increase a rate of a capacitive discharge such that the rate of a capacitive discharge charge is substantially equal to a rate of a capacitive charge.

In another embodiment, a level shifter circuit (e.g., a level shifter circuit 150 of FIG. 2A) may include a first set of transistors (e.g., as illustrated in a rise path of FIG. 2A) contributing to an intrinsic capacitive charge time, a second set of transistors contributing to an intrinsic capacitive discharge time (e.g., as illustrated in a fall path of FIG. 2B), and a n-channel metal-oxide semiconductor field-effect transistor (nMOSFET) (e.g., an nMOSFET 218) coupled to the second set of transistors having a gate input of an output voltage of the level shifter circuit to reduce the intrinsic capacitive discharge time such that the intrinsic capacitive discharge time is substantially equal to the intrinsic capacitive charge time.

In yet another embodiment, a method includes placing a n-channel metal-oxide semiconductor field-effect transistor (nMOSFET) (e.g., the nMOSFET of FIG. 2B) in a fall path of a level shifter circuit (e.g., the level shifter circuit 150 of FIG. 2B), coupling a voltage (e.g., the voltage $VDD_2$ 116 of FIG. 2B) the to a gate of the nMOSFET such that the voltage is the same as that of a circuit coupled to an output of the level shifter circuit, and reducing an inherent duty cycle error of the level shifter circuit by balancing a fall path of the level shifter circuit with a rise path.

Figure 1:
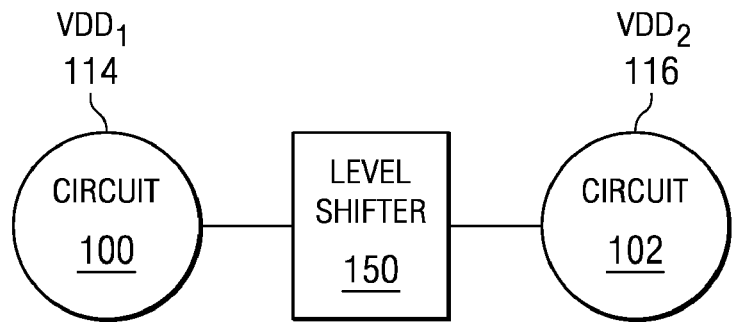
FIG. 1 is a schematic diagram of a level shifter circuit between a circuit with a first power supply voltage and a circuit with a second power supply voltage, according to one embodiment.

FIG. 1 is a schematic diagram of a level shifter circuit 150 between a circuit 100 with a first power supply voltage (e.g., a voltage $VDD_1$ 114 of FIG. 1) and a circuit 102 with a second power supply voltage (e.g., a voltage $VDD_2$ 116 of FIG. 1), according to one embodiment.

The level shifter circuit 150 may translate (e.g., shift, increase, decrease, etc.) an output signal level of a circuit (e.g., the circuit 100) operating at the first power supply voltage (e.g., the voltage $VDD_1$ 114 of FIG. 1) to the second power supply voltage (e.g., the voltage $VDD_2$ 116 of FIG. 1) of another circuit (e.g., the circuit 102), and vice versa. In one embodiment, the circuit 100 may be a number of circuits (e.g., a power supply system, an LCD display, a transducer etc.). The circuit 102 may also be a number of circuits (e.g., a phase lock loop, a controller, an A/D converter, etc.). The voltage $VDD_1$ 114 may be higher or lower than the voltage $VDD_2$ 116 in one embodiment.

Figure 2A:
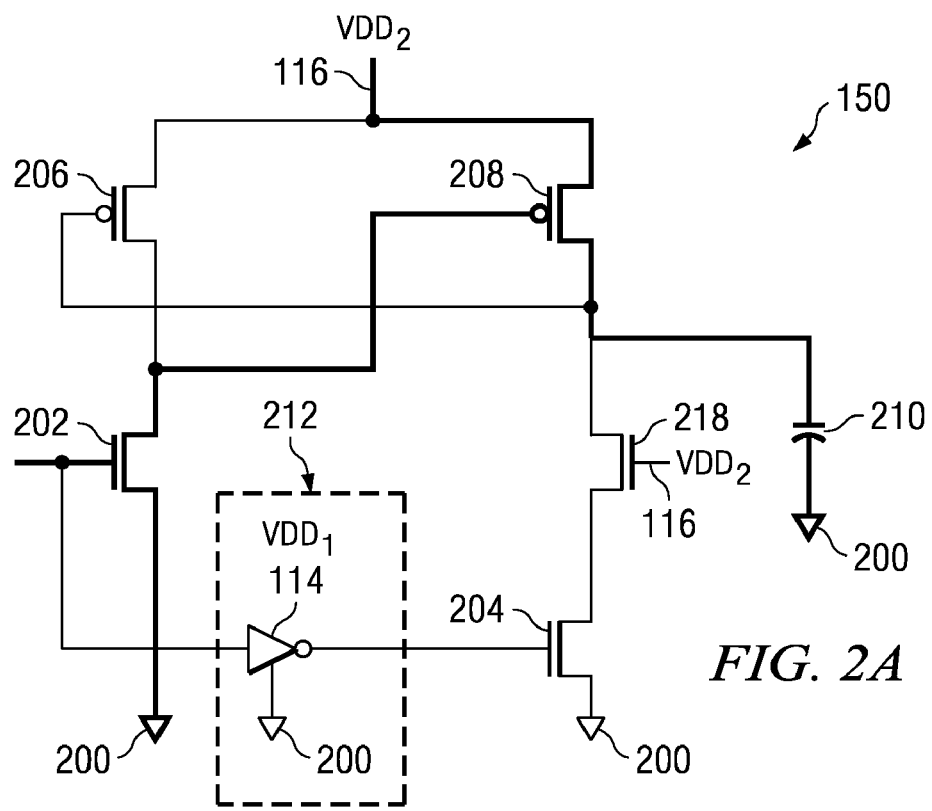
FIG. 2A is a transistor level exploded view diagram highlighting a rise path of the level shifter circuit of FIG. 1, according to one embodiment.

FIG. 2A is a transistor level exploded view diagram highlighting a rise path of the level shifter circuit 150, according to one embodiment. The rise path may include a number of devices (e.g., an nMOSFET 202, a pMOSFET 208, and a capacitor 210) related to a low to high transition of an output of the level shifter circuit 150 (e.g., as illustrated by an intrinsic capacitance of the capacitor 210 of FIG. 2A)

during a low to high transition at the input of the level shifter circuit 150 (e.g., as illustrated at the nMOSFET 202 of FIG. 2A).

A metal-oxide semiconductor field-effect transistor (MOSFET) may have either p-type (e.g., pMOSFET) or n-type (e.g., nMOSFET) conductive channel of the MOSFET during operation. A threshold voltage marks the formation of this conductive channel in the MOSFET and may thus enable current conduction. The nMOSFET and pMOSFET may act as a switch in an integrated circuit (e.g., a sensor, a level shifter, an LCD display, an A/D converter, a phase lock loop, etc.) as the MOSFET may only conduct significant current for operation (e.g., in a saturation region) when a certain threshold voltage on a gate has been reached. A current level of the MOSFET is also dependent on voltages applied to three other terminals of the MOSFET (e.g., a drain, a source, and a body).

During the low to high transition at the input of the level shifter circuit 150 (e.g., as illustrated at the nMOSFET 202 of FIG. 2A). An input of the pMOSFET 208 connected to a drain contact of the nMOSFET 202 may undergo a high to low transition. Due to a low signal at a gate of the pMOSFET 208, the pMOSFET 208 may be switched on which may charge a capacitor 210 to a power supply voltage (e.g., the voltage $VDD_2$ 116). A capacitor (e.g., the capacitor 210) may be charged due to a conduction path between a power supply (e.g., the voltage $VDD_2$ 116) and the capacitor (e.g., the capacitor 210) created by a conducting MOSFET (e.g., the pMOSFET 208).

Charging may occur due to an accumulation of charge on the capacitor (e.g., the capacitor 210) from current conduction resulting from a change in voltage across the capacitor (e.g., and/or plates of the capacitor). During the low to high transition of the input of the nMOSFET 202, a pMOSFET 206, and an nMOSFET 204 may be switched off. An inverter 212 may not be in the rise path (e.g., while the inverter 212 may be conducting, the signal path is incomplete due to the nMOSFET 204 being switched off). A ground 200 is a common ground for the level shifter circuit 150.

Figure 2B:
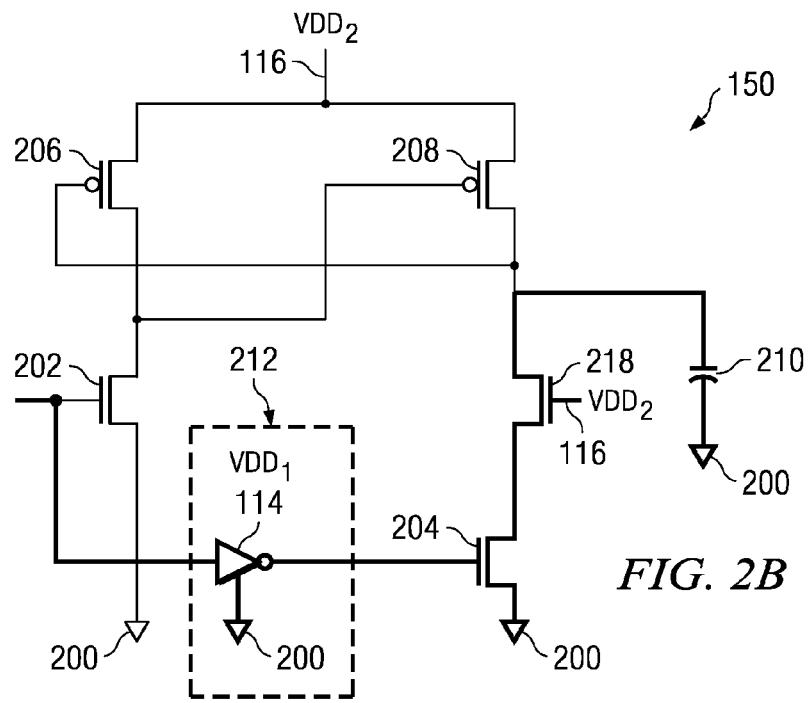
FIG. 2B is a transistor level exploded view diagram highlighting a fall path of the level shifter circuit of FIG. 1, according to one embodiment.

FIG. 2B is a transistor level exploded view diagram highlighting a fall path of the level shifter circuit 150 of FIG. 1, according to one embodiment. The fall path may comprise of a number of devices (e.g., an nMOSFET 204, an nMOSFET 218, the inverter 212, and the capacitor 210) related to a high to low transition of the output of the level shifter circuit 150 during a high to low transition at the input of the nMOSFET 202. A capacitor (e.g., the capacitor 210) may be formed by two plates (e.g., gate contact, source contact, drain contact, body contact, etc.) separated by a dielectric material (e.g., silicon dioxide, hafnium oxide, silicon nitride, etc.). The plates may be metallic and/or non-metallic.

The capacitor may and/or may not be able to charge or discharge when there is a change in voltage over the capacitor (e.g., the capacitor 210). In a MOSFET (e.g., a pMOSFET and an nMOSFET) structure, there may exist an intrinsic capacitance (e.g., a gate-source capacitance, a gate-drain capacitance, a source-body capacitance, a drain-body capacitance) formed by an overlapping of a metal-like region (e.g., a source contact, a drain contact, a gate polysilicon, a body contact, etc.) and the dielectric material (e.g., silicon dioxide, hafnium oxide, silicon nitride, etc.). The intrinsic capacitance may be parasitic and may decrease the maximum operating frequency of a circuit. A capacitor (e.g., the capacitor 210) which is initially charged may discharge through a direct path to a ground (e.g., the ground 200). Due to a conducting path (e.g. consisted of the nMOSFET 204 and the nMOSFET 218) between the capacitor (e.g., the capacitor 210) and the ground (e.g., the ground 200), the capacitor 210 may be discharged through a current flowing from the capacitor 210 through the conducting path to the ground.

During the high to low transition of the input of the nMOSFET 202, an input of the nMOSFET 204 connected to an output of an inverter 212 (e.g., the inverter 212 is illustrated as connected to the input of the nMOSFET 202) may undergo a low to high transition. Due to a high signal at a gate of the nMOSFET 204, the nMOSFET 204 may be switched on which may discharge the capacitor 210. An additional nMOSFET (e.g., nMOSFET 218) placed in the fall path of the level shifter circuit (e.g., the level shifter circuit 150) may improve a discharge time of a capacitor (e.g., the capacitor 210). For example, a rise path and a fall path may be better balanced as the fall path may be controlled by vdd1 and vdd2.

The pMOSFET 206 may be switched on due to a discharge of the capacitor 210. As a result, the capacitor 210 may not completely discharge to a ground 200 voltage. During the high to low transition of the input of the nMOSFET 202, a pMOSFET 208, and an nMOSFET 202 may be switched off. It should be noted that in alternate designs of the level shifter, the improved performance characteristics of an additional MOSFET (e.g., the nMOSFET 218) may be realized without the effect of a pull-up effect caused by a pMOSFET (e.g., the pMOSFET 206).

Figure 3A:
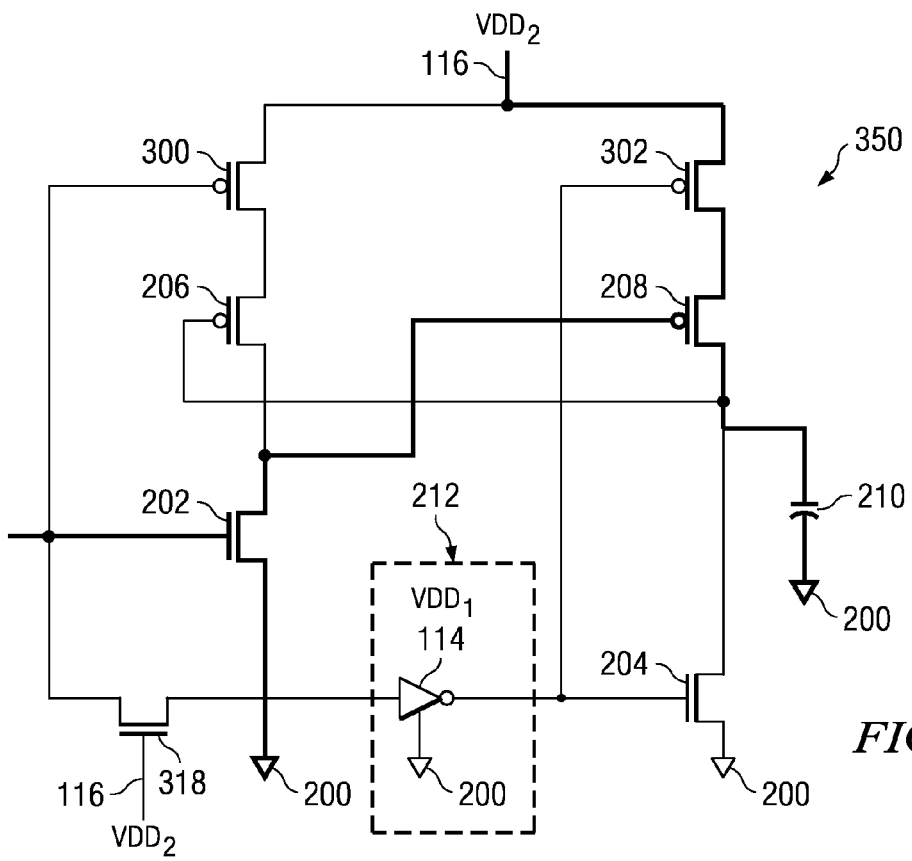
FIG. 3A is a transistor level exploded view diagram highlighting the rise path of an exemplary view of the level shifter circuit of FIG. 2A, according to one embodiment.

FIG. 3A is a transistor level exploded view diagram highlighting the rise path of an exemplary of the level shifter circuit 150 (e.g., the level shifter circuit 350) of FIG. 2A, according to one embodiment. The rise path of a level shifter circuit 350 may comprise of a plurality of devices (e.g., the nMOSFET 202, an nMOSFET 318, a pMOSFET 302, the pMOSFET 208, the inverter 212, and the capacitor 210) related to a low to high transition of an output of the level shifter circuit 350 during the low to high transition at the input of the nMOSFET 202.

During the low to high transition of the input of the nMOSFET 202, the input of the pMOSFET 208 connected to the drain contact of the nMOSFET 202 may undergo the high to low transition. The output of the inverter 212 is connected to an input of a pMOSFET 302 which may cause it to switch on. With both pMOSFETs 302 and 208 switched on, the capacitor 210 may be charged to the voltage $VDD_2$ 116. An operation of the rise path of the level shifter circuit 350 in FIG. 3A may be similar to that of the level shifter circuit 150 in FIG. 2A. The level shifter circuit 350 may dissipate reduced power because of an additional pMOSFET (e.g., the pMOSFET 308) in the rise path. The ground 200 is the common ground for the level shifter circuit 350.

Figure 3B:
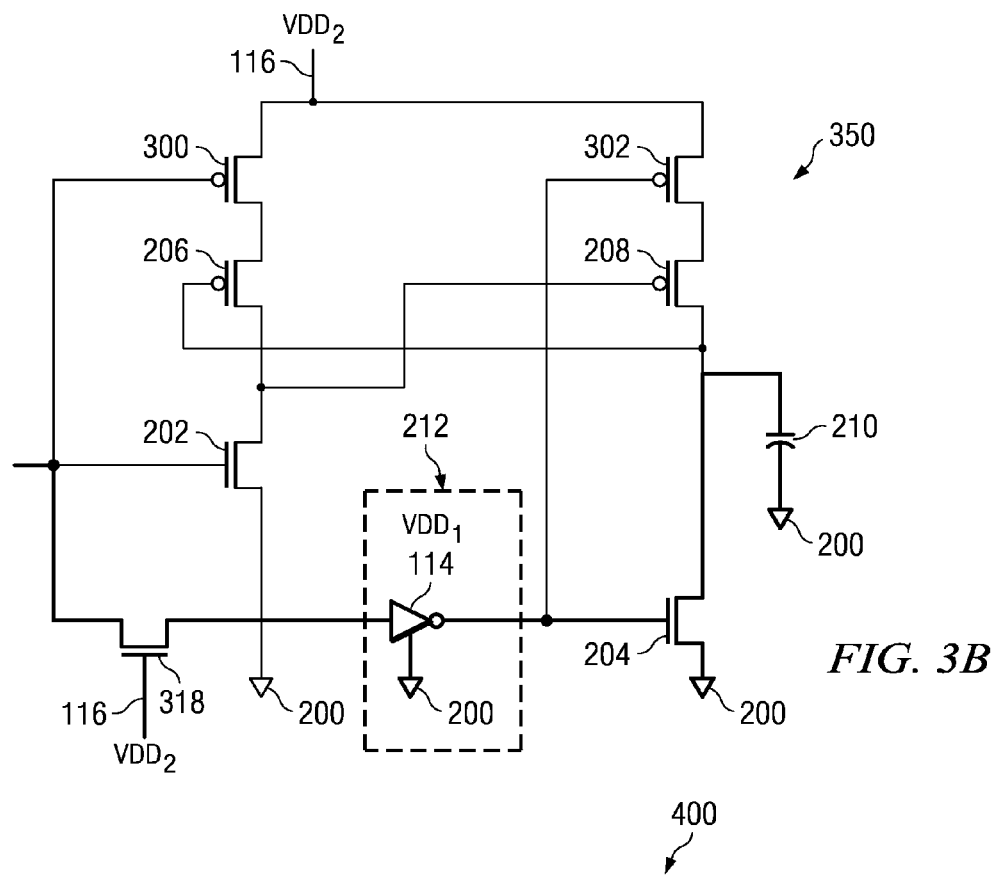
FIG. 3B a transistor level exploded view diagram highlighting the fall path of an exemplary view of the level shifter circuit of FIG. 2B, according to one embodiment.

FIG. 3B a transistor level exploded view diagram highlighting the fall path of an exemplary of the level shifter circuit 150 (e.g., the level shifter circuit 350) of FIG. 2B, according to one embodiment. The fall path of the level shifter circuit 350 may comprise of a number of devices (e.g., the nMOSFET 204, the nMOSFET 318, the inverter 212, and the capacitor 210) directly related to a high to low transition of the output of the level shifter circuit 350 during the high to low transition at the input of the nMOSFET 202. During the high to low transition of the input of the nMOSFET 202, an output of the nMOSFET 318 which is connected to an input of the inverter 212 may transition from high to low. Therefore, the output of the inverter 212 may undergo a low to high transition which may switch on the nMOSFET 204.

With the nMOSFET 204 switched on, the capacitor 210 may be discharged through the nMOSFET 204. A pMOS- FET 300 is switched on during a high to low transition on the input of the nMOSFET 202 and a pMOSFET 206 may be switched on due to a discharge of the capacitor 210. During the high to low transition of the input of the nMOSFET 202, a pMOSFET 302, the pMOSFET 208, and the nMOSFET 202 may be switched off. An operation of the fall path of the level shifter circuit 350 in FIG. 3B may be similar to that of the level shifter circuit 150 in FIG. 2B.

By including an additional nMOSFET (e.g., the nMOSFET 318) in the fall path, a discharge time of the capacitor 210 may be decreased due to increased pull-down current. An improvement in the discharge time may result in improved circuit performance characteristics (e.g., duty cycle correction).

Figure 4:
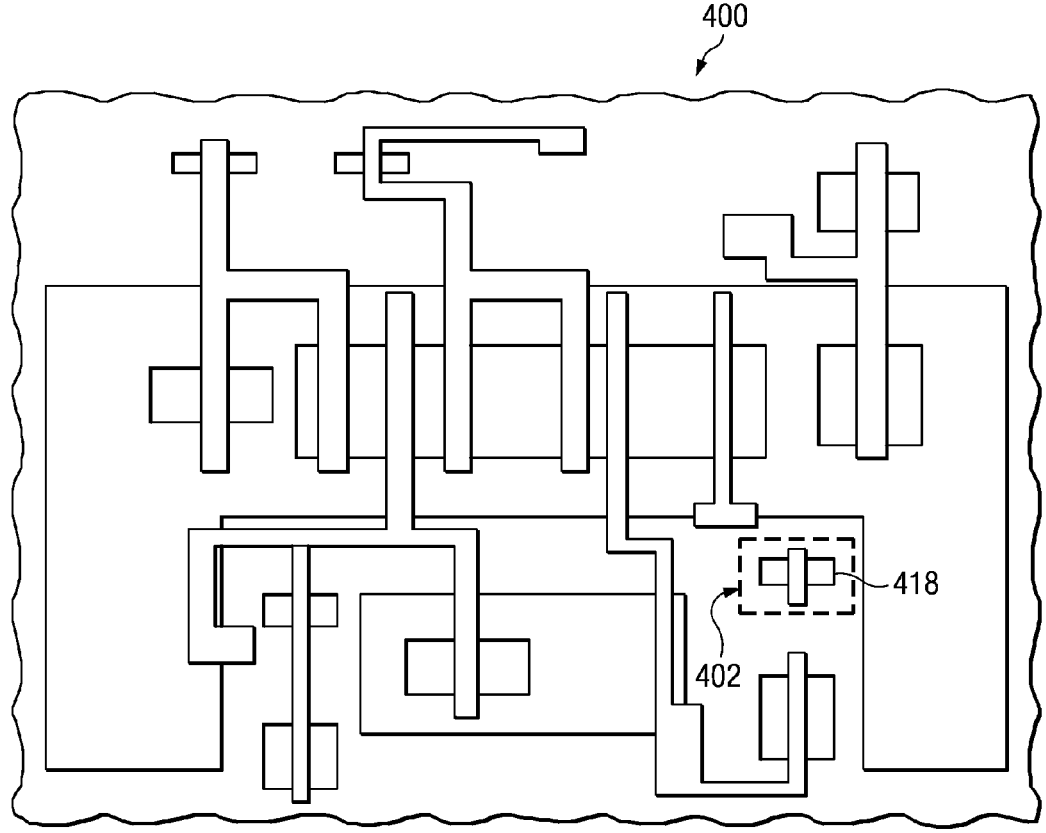
FIG. 4 is a layout view a level shifter circuit having an available region where an nMOSFET is placed, according to one embodiment.

FIG. 4 is a layout 400 of the level shifter circuit 350, according to one embodiment. An nMOSFET (e.g., an nMOSFET 418) may be placed in a space (e.g., a space 402) between voltage n-wells of the level shifter circuit 350 without increasing the physical area of the level shifter circuit. A layout (e.g., layout 400) may be a blue print created by an integrated circuit designer to indicate where each component (e.g., a pMOSFET, an nMOSFET, an inverter, a capacitor, an inductor, a resistor, etc.) is physically located on a semiconductor substrate (e.g., silicon, silicon-on-insulator, germanium, etc.). The layout (e.g., the layout 400) may assist a foundry in a fabrication process of an integrated circuit.

Figure 5:
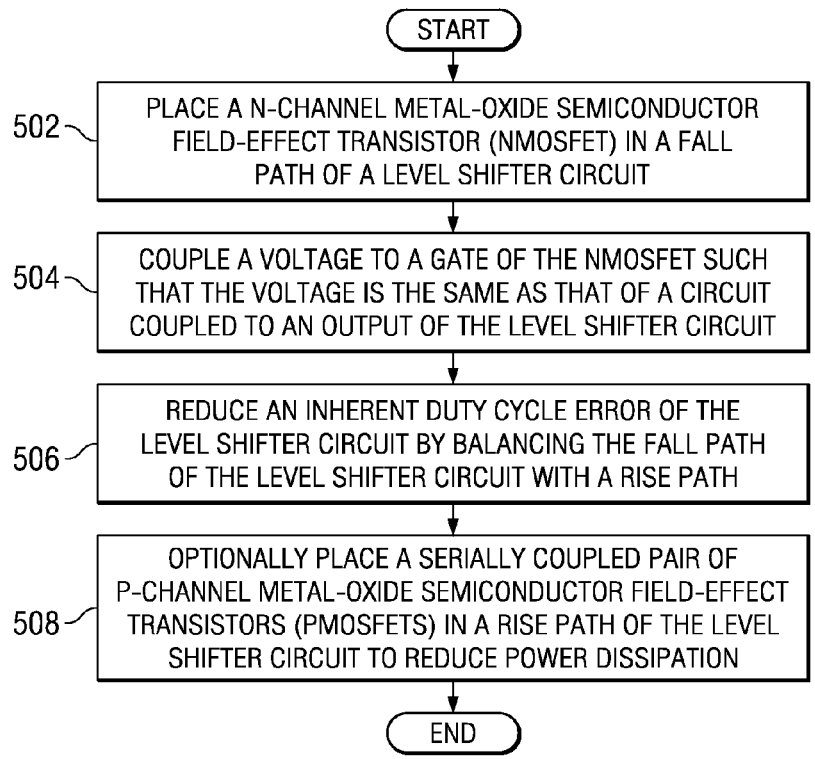
FIG. 5 is a process flow of reducing an inherent duty cycle error of a level shifter circuit by balancing of a fall path of the level shifter circuit with a rise path, according to one embodiment.

FIG. 5 is a process flow of reducing an inherent duty cycle error of a level shifter circuit by balancing a fall path of the level shifter circuit with a rise path, according to one embodiment. In operation 502, an nMOSFET (e.g., the nMOSFET 318 of FIG. 3B) may be placed in a fall path of a level shifter circuit (e.g., the level shifter circuit 350 of FIG. 3B). In operation 504, a voltage (e.g., voltage $VDD_1$ 114 of FIG. 1, voltage $VDD_2$ 116 of FIG. 1, etc.) may be coupled to a gate of the nMOSFET (e.g., the nMOSFET 318 of FIG. 3B) such that the voltage (e.g., voltage $VDD_1$ 114 of FIG. 1, voltage $VDD_2$ 116 of FIG. 1, etc.) may be the same as that of a circuit (e.g., the circuit 100 and/or the circuit 102 of FIG. 1) coupled to an output of the level shifter circuit (e.g., the level shifter circuit 150 of FIG. 1, the level shifter circuit 350 of FIG. 3A).

Then, in operation 506, an inherent duty cycle error of the level shifter circuit e.g., the level shifter circuit 150 of FIG. 1, the level shifter circuit 350 of FIG. 3A) may be reduced by balancing a fall path of the level shifter circuit with a rise path. (e.g., the level shifter circuit 150 of FIG. 1, the level shifter circuit 350 of FIG. 3A). In operation 508, a serially coupled pair of pMOSFETs (e.g., the pMOSFET 302 and the pMOSFET 208 of FIG. 3A) may be optionally placed in a rise path (e.g., a highlighted path of FIG. 3A) of the level shifter circuit (e.g., the level shifter circuit 350 of FIG. 3A) to reduce power dissipation (e.g., static power and/or dynamic power).

Figure 6:
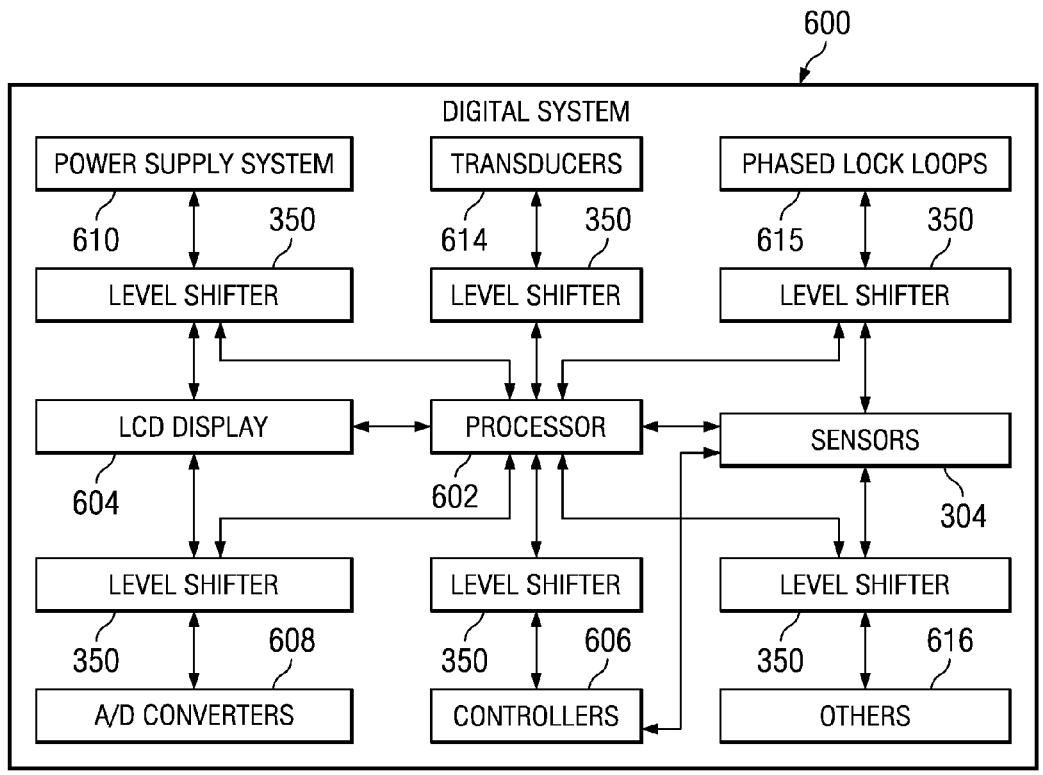
FIG. 6 is a diagram of a system having a number of circuits communicating with a processor through the level shifter circuit of FIG. 3, according to one embodiment.

FIG. 6 is a diagram of a system 600 (e.g., a personal computer, a PDA, a cell phone, an MP3 player, etc.) having a number of circuits communicating with a processor 602 through the level shifter circuit 350 of FIG. 3, according to one embodiment. An output voltage of a variety of circuits (e.g., a power supply system 610, a transducer 614, a phase lock loop 615, an LCD display 604, a sensor 304, an A/D converter 608, a controller 606, and an others 616) may be converted to an operating voltage (e.g., a voltage $VDD_1$ 114 of FIG. 1, a voltage $VDD_2$ 116 of FIG. 1, etc) that is compatible with a processing system (e.g., the processor 602).

For example, the power supply system 610 may be operating at a voltage that is higher or lower than that of the processing system (e.g., the processor 602). Without a level shifter (e.g., the level shifter circuit 350) to convert the output voltage of the power supply system 610 to a level is that compatible with the processor 602, a data may be interpreted as high when it is in fact low, and vice versa. If the output of the power supply system 610 is higher than a maximum compatible voltage level (e.g., the voltage $VDD_1$ 114 of FIG. 1) of the processor 602 (e.g., may be a processing system), permanent electrical and/or physical damage of the processor 602 may be done.

It should be noted that in all embodiments and in FIGS. 1-3 a body contact of each pMOSFET is connected to a power supply (e.g., the voltage $VDD_1$ 114, the voltage $VDD_2$ 116) of a level shifter circuit (e.g., the level shifter circuit 150, the level shifter circuit 350, etc) and a body contact of each nMOSFET is connected to the ground 200 for an operation as described above.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enable and operated using hardware circuitry (e.g., CMOS based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated ASIC circuitry and/or in Digital Signal; Processor DSP circuitry).

In addition, it will be appreciated that the various operations, processes, and methods disclosed herein may be embodied in a machine-readable medium and/or a machine accessible medium compatible with a data processing system (e.g., a computer system), and may be performed in any order. Accordingly, the specification and drawings are to be regarded in an illustrative rather than a restrictive sense.

What is claimed is:

1. A system, comprising:
    a first circuit to operate based on a first voltage of a first power supply;
    a second circuit to operate based on a second voltage of a second power supply;
    a level shifter circuit between the first circuit and the second circuit to translate between the first voltage of the first power supply and the second voltage of the second power supply; and
    the level shifter circuit comprises a n-channel metal-oxide semiconductor field-effect transistor (nMOSFET) having a gate input of the second voltage and serially coupled in a fall path of the level shifter circuit to increase a rate of a capacitive discharge such that the rate of a capacitive discharge charge is substantially equal to a rate of a capacitive charge.

2. The system of claim 1 wherein the rate of capacitive discharge and the rate of capacitive charge is caused by an intrinsic diffusion capacitance of the level shifter circuit, and wherein at least one of the second voltage and the first voltage is a variable voltage.

3. The system of claim 2 wherein the nMOSFET rectifies a skew in a duty cycle of the level shifter circuit associated with the intrinsic diffusion capacitance.

4. The system of claim 3 wherein the duty cycle is maintained at a level of approximately 50% throughout the system.

5. The system of claim 3 wherein the duty cycle is shared with at least one component external to the system.

6. The system of claim 1 wherein the nMOSFET is placed in a space between voltage n-wells of the level shifter circuit without increasing a physical area of the level shifter circuit.

7. The system of claim 1 wherein the nMOSFET is serially placed before an inverter circuit in the fall path of the level shifter circuit.

8. The system of claim 7 wherein the nMOSFET balances the fall path and the rise path of the level shifter circuit.

9. A level shifter circuit, comprising:
a first set of transistors contributing to an intrinsic capacitive charge time;
a second set of transistors contributing to an intrinsic capacitive discharge time; and
a n-channel metal-oxide semiconductor field-effect transistor (nMOSFET) coupled to the second set of transistors having a gate input of an output voltage of the level shifter circuit to reduce the intrinsic capacitive discharge time such that the intrinsic capacitive discharge time is substantially equal to the intrinsic capacitive charge time.

10. The level shifter circuit of claim 9 wherein a difference in the intrinsic capacitive discharge time and the intrinsic capacitive charge time is affected by a diffusion capacitance parasitically associated with the level shifter circuit, and wherein the output voltage is a variable voltage dependent upon a voltage requirement of a logic circuit coupled to the output of the level shifter.

11. The level shifter circuit of claim 10 wherein the nMOSFET rectifies a skew in a duty cycle of the level shifter circuit associated with the diffusion capacitance.

12. The level shifter circuit of claim 11 wherein the duty cycle is maintained at a level of approximately 50% throughout the logic circuit and other circuits communicatively coupled with the logic circuit.

13. The level shifter circuit of claim 12 wherein the duty cycle is shared with at least one component external to the logic circuit.

14. The level shifter circuit of claim 9 wherein the nMOSFET is placed in a space between voltage n-wells of the level shifter circuit without increasing a physical area of the level shifter circuit.

15. The level shifter circuit of claim 9 wherein the first set of transistors are associated with a rise path of the level shifter circuit, wherein the second set of transistors are associated with a fall path of the level shifter circuit, and wherein the level shifter circuit is serially coupled anywhere in the fall path.

16. The level shifter circuit of claim 15 further comprising a serially coupled pair of p-channel metal-oxide semiconductor field-effect transistors (pMOSFETs) in the rise path of the level shifter circuit to reduce power dissipation.

17. A method, comprising:
placing a n-channel metal-oxide semiconductor field-effect transistor (nMOSFET) in a fall path of a level shifter circuit;
coupling a voltage to a gate of the nMOSFET such that the voltage is the same as that of a circuit coupled to an output of the level shifter circuit; and
reducing an inherent duty cycle error of the level shifter circuit by balancing the fall path of the level shifter circuit with a rise path.

18. The method of claim 17 wherein the nMOSFET is placed in a space between voltage n-wells of the level shifter circuit without increasing a physical area of the level shifter circuit.

* * * * *

UNITED STATES PATENT AND TRADEMARK OFFICE
CERTIFICATE OF CORRECTION

PATENT NO. : 7,352,228 B2
APPLICATION NO. : 11/416608
DATED : April 1, 2008
INVENTOR(S) : Shahid Ali, Sujan Manohar and Satheesh Balasubramanian Page 1 of 1

It is certified that error appears in the above-identified patent and that said Letters Patent is hereby corrected as shown below:

On the Title Page
Item (57) should read

ABSTRACT:
A method and apparatus of a level shifter circuit with duty-cycle correction is disclosed. In one embodiment, a system includes a first circuit to operate based on a first voltage of a first power supply, a second circuit to operate based on a second voltage of a second power supply, a level shifter circuit between the first circuit and the second circuit to translate between the first voltage of the first power supply and the second voltage of the second power supply, and a n-channel metal-oxide semiconductor field-effect transistor (nMOSFET) having a gate input of the second voltage and serially coupled in a fall path of the level shifter circuit to increase a rate of a capacitive discharge such that the rate of a capacitive discharge charge is substantially equal to a rate of a capacitive charge (e.g., the fall delay may also increase a bit because of an extra transistor).

Signed and Sealed this

Sixteenth Day of December, 2008

JON W. DUDAS
*Director of the United States Patent and Trademark Office*